(12) United States Patent
Acton et al.

(10) Patent No.: US 12,316,114 B2
(45) Date of Patent: May 27, 2025

(54) SYSTEMS AND METHODS FOR AI CONTINUED LEARNING IN ELECTRICAL POWER GRID FAULT ANALYSIS

(71) Applicant: Qualitrol Company LLC, Fairport, NY (US)

(72) Inventors: Aaron Acton, Pittsburgh, PA (US); Peter Glover, Belfast (GB); Mark Diamond, Bellaghy (GB); Peter Brett, Belfast (GB); David Cole, Ware (GB); Paul Donegan, Dunoon (GB)

(73) Assignee: Qualitrol Company LLC, Fairport, NY (US)

( * ) Notice: Subject to any disclaimer, the term of this patent is extended or adjusted under 35 U.S.C. 154(b) by 393 days.

(21) Appl. No.: 17/875,285

(22) Filed: Jul. 27, 2022

(65) Prior Publication Data

US 2023/0036218 A1     Feb. 2, 2023

Related U.S. Application Data

(60) Provisional application No. 63/226,123, filed on Jul. 27, 2021.

(51) Int. Cl.
*H02J 3/00*     (2006.01)
*G01R 31/08*    (2020.01)
*G05B 23/02*    (2006.01)

(52) U.S. Cl.
CPC .......... *H02J 3/0012* (2020.01); *G01R 31/086* (2013.01); *G01R 31/088* (2013.01); *G05B 23/0245* (2013.01); *G05B 23/0278* (2013.01)

(58) Field of Classification Search
USPC ........................................................ 700/286
See application file for complete search history.

(56) References Cited

U.S. PATENT DOCUMENTS

| | | | |
|---|---|---|---|
| 9,917,436 B2 | 3/2018 | Popescu | |
| 2010/0205032 A1* | 8/2010 | Nielsen | G06Q 10/06311 715/702 |

OTHER PUBLICATIONS

Notice of Allowance, dated Mar. 1, 2023, for U.S. Appl. No. 17/875,280. 1 (13 pages).

* cited by examiner

*Primary Examiner* — Farhana A Hoque
(74) *Attorney, Agent, or Firm* — Seed Intellectual Property Law Group LLP (57) ABSTRACT

Systems, methods, and processor-readable storage media for AI continued learning in electrical power grid fault analysis use historical fault record data to generate a fault cause prediction model for predicting the cause of a fault, and modify the fault cause prediction model based on additional technician data received from power grid technicians. The systems disclosed herein additionally receive an indication of a fault which has occurred in a power grid, obtain a prediction of the cause of the fault by applying the indication of the fault to the fault cause prediction model, and cause the predicted cause of the fault to be remedied.

18 Claims, 8 Drawing Sheets

SYSTEMS AND METHODS FOR AI CONTINUED LEARNING IN ELECTRICAL POWER GRID FAULT ANALYSIS

CROSS-REFERENCE TO RELATED APPLICATION

This application claims the benefit of U.S. Provisional Patent Application Ser. No. 63/226,123, filed Jul. 27, 2021, the entirety of which is hereby incorporated by reference. In cases where the present application conflicts with a document incorporated by reference, the present application controls.

BACKGROUND

Technical Field

The present disclosure is directed to fault analysis systems used by electrical power grid operators. These operators typically diagnose the cause of a fault by inspecting fault records generated by equipment or components used in the electrical power grid, such as electrical substations, power lines, intelligent electronic devices, or other electrical power grid components.

Description of the Related Art

Generally, operators of an electrical power grid receive an indication that a fault has occurred from computing systems or devices connected to the electrical power grid components. The operator then manually searches for a fault record created for the fault, and attempts to diagnose the cause of the fault based on information in the fault record. The fault record may additionally be analyzed by a computing system to determine a categorization or classification of the fault record. This process is performed at multiple power grids and utilities.

Each fault may cause a large number of records to be generated, where only a few of the records are useful in diagnosing the cause of the fault. Thus, even though the fault records are classified, operators must typically still manually identify the cause of the fault by examining information in each of the fault records generated. Repair costs, as well as other costs, to the utility operating the power grid increase with each minute spent analyzing the fault, as further downtime or even damage may occur in the power grid, and other substations or components may be affected by the original, "primary" fault. These costs can be exacerbated when an operator misidentifies the cause of the fault by not analyzing the correct fault records.

Furthermore, operators are typically unable to view data from other power grids or utilities to use that data to assist in the determination of the cause of the fault in order to minimize the downtime or damage to the power grid or utility. Additionally, because operators are unable to view data from other utilities or power grids, they must spend additional time determining the causes of faults when the causes of similar faults at other power grids or utilities have already been determined. Operators may also misidentify the causes of such faults because they do not have access to the data from other power grids or utilities. Operators may also be unaware of other sources of data outside of the fault records which may be crucial in determining the actual cause of the fault.

BRIEF SUMMARY

The embodiments described herein address the issues above and thus help solve the technical problems and improve the technology for power grid fault analysis by generating a system which automatically identifies the causes of faults that occur in a power grid. Additionally, the embodiments disclosed herein are able to change the generated system based on technician or operator data (collectively "technician data") obtained from a plurality of power grids or utilities (collectively "power grids").

According to at least one embodiment of a power grid fault analysis system, the power grid fault analysis system receives a plurality of historical fault records in an electrical power grid including a plurality of substations, each historical fault record including: a category of a fault and a cause of the fault. The power grid fault analysis system generates a fault cause prediction model based on the plurality of historical fault records. The power grid fault analysis system receives technician data from one or more technicians, the technician data including an indication of at least one additional historical fault and at least one cause of the additional historical fault. The power grid fault analysis system modifies the fault cause prediction model based on the technician data. The power grid fault analysis system receives an indication of a fault that has occurred in the electrical power grid, the indication including a fault record associated with the fault, the fault record being generated by a substation of the plurality of substations. The power grid fault analysis system obtains a prediction of the cause of the fault by applying the indication of the fault to the modified fault cause prediction model and, based on the prediction of the cause of the fault, causes the predicted cause of the fault to be remedied.

In some embodiments, the fault cause prediction model comprises one or more of: a machine learning model and/or a rules-based model.

In some embodiments, the technician data comprises data indicating the status of one or more pieces of equipment associated with the additional historical fault and data indicating whether at least one piece of equipment of the one or more pieces of equipment was repaired after the additional historical fault occurred.

In some embodiments, the power grid fault analysis system determines whether a predetermined amount of technician data has been received from the one or more technicians. The power grid fault analysis system modifies the fault cause prediction model based on the technician data based on a determination that the predetermined amount of technician data has been received. In some embodiments, the power grid fault analysis system causes the technician data to be validated before the fault cause prediction model is modified.

In some embodiments, the fault cause prediction model comprises at least one machine learning model and at least one rules-based model, and the power grid fault analysis system modifies the fault cause prediction model based on the technician data. The power grid fault analysis system may modify one or more weights used by the fault cause prediction model to combine a first prediction obtained from the at least one machine learning model with a second prediction obtained from the at least one rules-based model.

In some embodiments, the power grid fault analysis system identifies a plurality of electrical power grids that employ the fault cause prediction model and deploys the modified fault cause prediction model to each electrical power grid of the plurality of electrical power grids.

In some embodiments, the power grid fault analysis system receives an indication of whether the predicted cause of the fault is correct and modifies the fault cause prediction model based on the indication of whether the predicted cause of the fault is correct.

In some embodiments, the power grid fault analysis system identifies additional fault records based on one or more of a fault record and a prediction of the cause of the fault associated with the fault record. The additional fault records may be generated by at least one other substation which is a different substation from the substation which generated the fault record. The power grid fault analysis system may modify the fault cause prediction model based on one or more of the additional fault records and the first fault record to identify fault records related to a fault.

DETAILED DESCRIPTION

The present disclosure is directed to a power grid fault analysis system for generating a fault cause prediction model for identifying the causes of the faults which occur in an electrical power grid. The power grid fault analysis system may additionally modify the fault cause prediction model based on technician data received from a plurality of technicians. Furthermore, the power grid fault analysis system may use the modified fault cause prediction model to identify the cause of a fault and cause the cause of the fault to be remedied.

Unless the context requires otherwise, throughout the specification and claims which follow, the word "comprise" and variations thereof, such as, "comprises" and "comprising" are to be construed in an open, inclusive sense, for example "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. The term "or" is generally employed in its sense including "and/or" unless the content clearly dictates otherwise.

The headings and Abstract of the Disclosure provided herein are for convenience only and do not interpret the scope or meaning of the embodiments.

Implementations of the present disclosure are directed to computer-implemented systems and methods for fault analysis in electrical power grids, including generating fault cause prediction models for identifying and remedying the causes of such faults. The fault cause prediction models may be modified based on technician data to further improve such models in the identification and remedying of faults. Thus, the aforementioned inefficient and unreliable processes in conventional systems are improved to provide improved fault cause prediction models that were previously not possible using conventional workflows. Additionally, by more accurately and reliably predicting the cause of a fault and remedying the cause, the electrical power grid has less downtime and is able to resume normal operation much quicker than by using conventional methods.

In the present disclosure, different types of faults, such as a "primary fault" and a "secondary fault" may be described. A primary fault may be a fault which occurs on the power grid, and is typically the first fault in a series of faults. A secondary fault may be a fault which is caused, assumed to be caused, etc., by a primary fault. Aspects of the primary fault may be used to determine whether a fault is a secondary fault, or a separate fault unrelated to the primary fault. In some embodiments, the layout, organization, or other aspects of the power grid, or the components within the power grid, are used to determine whether a fault is a secondary fault or whether the fault is unrelated to the primary fault.

Such implementations are thus able to improve the functioning of computer or other hardware, such as by reducing the dynamic display area, processing, storage, and/or data transmission resources needed to perform a certain task, thereby enabling the task to be performed by less capable, and/or expensive hardware devices, and/or be performed with lesser latency, and/or preserving more valuable resources for use in performing other tasks. For example, by changing or modifying a fault cause prediction system based on new data, the power grid fault analysis system is able to reduce the amount of computing resources used by operators to search for and evaluate fault records in attempting to address a cause of a fault. Additionally, by generating an initial fault cause prediction model, the power grid fault analysis system is able to provide predictions of the causes of a fault in a power system and cause the fault to be remedied. Likewise, such implementations improve the operation of the electrical power grid as a whole, by improving the ability of operators to quickly and correctly implement remedies for faults which have occurred in the electrical power grid.

Furthermore, such implementations are able to more quickly and accurately arrive at a determination of a root cause of a fault, including a power grid disturbance than, current computing or manual methods of making this determination. Therefore, such implementations of the present disclosure are able to minimize the downtime of the power grid due to the fault, such as by allowing operators to react much faster to repair the fault than conventional methods of determining fault causes.

Figure 1:
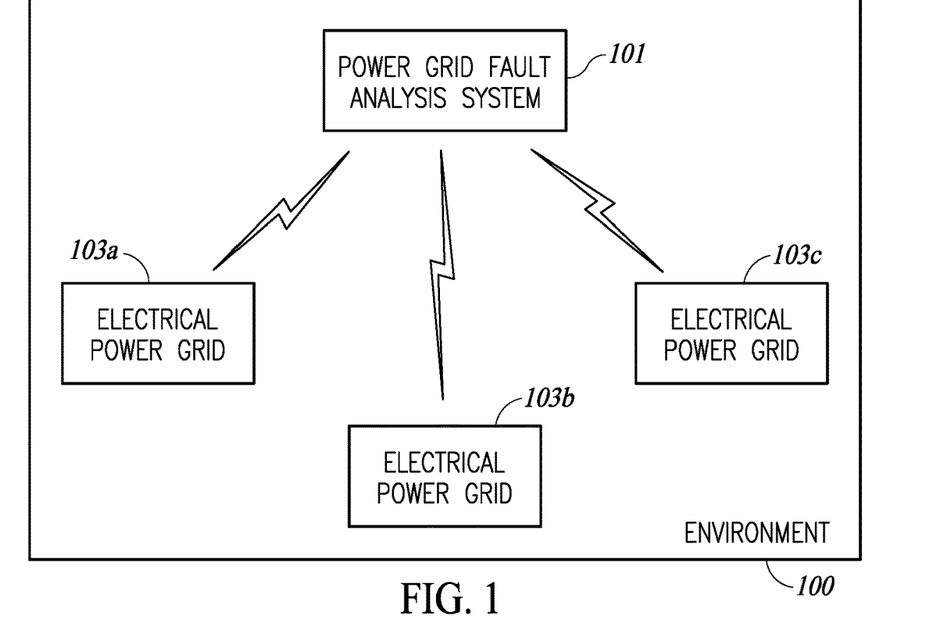
FIG. 1 is a sample environment in which a power grid fault analysis system may operate, according to various embodiments described herein.

FIG. 1 is a sample environment 100 in which a power grid fault analysis system may operate, according to various embodiments described herein. It is to be appreciated that FIG. 1 illustrates just one example of an environment 100 and that the various embodiments discussed herein are not limited to the use of such an environment. The environment 100 includes a power grid fault analysis system 101, and a plurality of electrical power grids 103a-103c. Each electrical power grid 103 may include electrical power grid components (not shown).

The power grid fault analysis system 101 may communicate with power grids, such as the power grids 103, through one or more computing devices, servers, etc., associated with the power grid. The power grid fault analysis system 101 may communicate with a power grid to: receive fault records, such as historical fault records, primary fault records, secondary fault records, or other fault records. The power grid fault analysis system 101 may communicate with a power grid to provide a prediction of a cause of a fault. The power grid fault analysis system 101 may communicate with a power grid via one or more computing devices, servers, etc., associated with the power grid, to cause a predicted cause of a fault to be remedied. Furthermore, the power grid system 101 may communicate with one or more power grid operators or technicians to receive technician data associated with a power grid, such as to receive technician data. The power grid fault analysis system is further described below with respect to FIG. 2.

The electrical power grids 103a-103c (collectively "electrical power grids 103") are electrical power grids which are able to generate, transmit, and/or distribute power to a region. It is to be appreciated that although FIG. 1 illustrates the use of the power grid fault analysis system in connection with electrical power grids as a whole, the power grid fault analysis system may be used in connection with one or more of the power generation, power transmission, or power distribution aspects of an electrical power grid, without being applied to a power grid as a whole. Furthermore, although FIG. 1 illustrates the power grid fault analysis system 101 as separate from each of the electrical power grids 103, a power grid fault analysis system 101 may be included in at least one electrical power grid 103, such as being included in, installed on, accessible by, etc., one or more computer systems associated with the electrical power grid 103.

An electrical power grid, such as one of the electrical power grids 103, includes one or more electrical power grid components. The electrical power grid components may include: substations; power lines; equipment used in the power grid; intelligent electronic devices; electrical devices such as a transformer, a generator, an electrical connection, an electrical engine, or other type of electrical device or power driven device; or other components, equipment, or utility assets used in an electrical power grid. Each of the electrical power grid components may communicate their current status, the status of other electrical power grid components, or other data related to an electrical power grid component of the electrical power grid. For example, an electrical power grid component may generate a fault record, and may transmit that fault record to a computing system included in the electrical power grid used for monitoring and maintaining electrical power grid components.

The power grid fault analysis system 101 and electrical power grids 103 included in the environment 100 may communicate via a network. Non-limiting examples of such a network include, but are not limited to, an Ethernet system, twisted pair Ethernet system, an intranet, a local area network (LAN) system, short range wireless network (e.g., Bluetooth®), a personal area network (e.g., a Zigbee network based on the IEEE 802.15.4 specification), a Consumer Electronics Control (CEC) communication system, Wi-Fi, satellite communication systems and networks, cellular networks, cable networks, 4G/5G/6G network, or the like. The power grid fault analysis system 101, electrical power grids 103, and one or more operator user devices, such as PCs, tablets, laptop computers, smartphones, personal assistants, Internet connection devices, wireless LAN, WiFi, Worldwide Interoperability for Microwave Access (WiMax) devices, or the like, may be communicatively coupled to the network and/or to each other so that they may communicate via the network. Thus, such a network enables power grid fault analysis system 101 to transmit or receive data from the electrical power grids 103, including new or modified fault cause prediction models.

The above description of the environment 100, and the various networks, power grids, systems, components, and functions therein, is intended as a broad, non-limiting overview of an example environment in which various embodiments of a power grid fault analysis system can operate. The environment 100, and the various devices, power grids, systems, and components therein, may contain other devices, systems and/or media not specifically described herein. The environment 100, and the various functions therein, may contain other functions, systems and/or media not specifically described herein.

Figure 2:
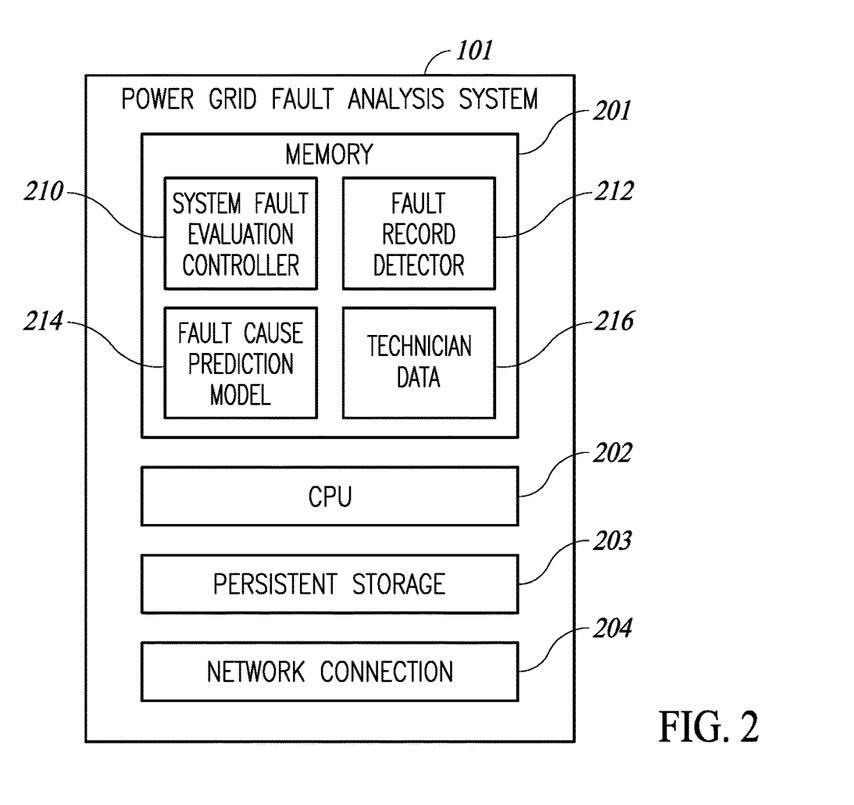
FIG. 2 is a block diagram of a power grid fault analysis system, according to various embodiments described herein.

FIG. 2 is a block diagram of a power grid fault analysis system 101, according to various embodiments described herein. In various embodiments, the power grid fault analysis system 101 includes one or more of the following: a computer memory 201 for storing programs and data, including data associated with the electrical power grids 103, electrical power grid components, fault records, an operating system including a kernel, and device drivers; a central processing unit (CPU) 202 for executing computer programs; a persistent storage device 203, such as a hard drive or flash drive for persistently storing programs and data; and a network connection 204 for communicatively connecting to one or more computer devices, functions or components of the electrical power grids 103, electrical power grid components, operator computing devices, other systems associated with an electrical power grid, and/or other computer systems, to send and/or receive data, such as via the Internet or another network and associated networking hardware, such as switches, routers, repeaters, electrical cables and optical fibers, light emitters and receivers, radio transmitters and receivers, and the like. In various embodiments, the power grid fault analysis system 101 additionally includes user input and output devices, such as a keyboard, a mouse, display devices, etc.

The memory 201 may include a power grid fault evaluation controller 210, a fault record detector 212, a fault cause prediction model 214, and technician data 216. The power grid fault evaluation controller 210 performs the core functions of the power grid fault analysis system 101, and may use the fault record detector 212 and fault cause prediction model 214 to perform aspects of the core functions of the power grid fault analysis system 101, such as the aspects described below with respect to FIGS. 3a-10. In particular, the power grid fault analysis system may generate fault cause predication models based on historical fault records, modify fault cause prediction models based on technician data, and use the fault cause prediction models to identify a prediction of the cause of faults.

The fault record detector 212 may be used by the power grid fault evaluation controller 210 to detect one or more faults, such as one or more primary faults, one or more secondary faults, or other faults. The fault detector 212 may additionally include a rules-based engine for categorizing faults. Examples of such categories are further described below with respect to FIG. 3a.

The fault cause prediction model 214 may be used by the power grid fault evaluation controller 210 to generate a prediction of the cause of a fault. In some embodiments, the fault cause prediction model 214 includes an AI or machine learning model trained to predict the cause of a primary fault based on at least one or more fault records related to one or more of the primary fault and one or more secondary faults. In some embodiments, the fault cause prediction model 214 includes a rules-based algorithm configured to predict the cause of a primary fault based on one or more fault records related to the primary fault. The fault cause prediction model 214 may use both a rules-based algorithm and a machine learning model to generate a prediction of the cause of the fault. In some embodiments, the fault cause prediction model 214 is used to generate a prediction of the cause of a primary fault.

The technician data 216 may include data obtained from one or more technicians each associated with one or more power grids, power systems, utilities, etc. The technician data may include an indication of faults whose cause has been identified, as well as an indication of data that was useful in identifying the causes of such faults. In some embodiments, the technician data includes fault records for faults whose causes have been identified, fault parameters for such faults, fault categories, additional data used to determine the cause of the fault, equipment associated with the fault, power grid components associated with the fault, or other data related to faults. In some embodiments, the technician data includes indications of faults whose causes have been verified by a technician or operator. In some embodiments, the technician data includes data related to the accuracy of the fault cause prediction model in predicting the cause of the fault.

In particular, the power grid fault evaluation controller 210 may receive an indication of historical fault records and may generate a fault cause prediction model based on the historical fault records. Additionally, the power grid fault evaluation controller 210 may receive technician data from one or more technicians, and may use the technician data to modify the fault cause prediction model, such as by performing one or more of: model re-training for one or more models used in the fault cause prediction model, supervised learning for one or more models used in the fault cause prediction model, or other methods of modifying, changing, or adjusting models based on additional data. Furthermore, the power grid fault evaluation controller 210 may cause a fault cause prediction model to be deployed for use by a plurality of power grids, such that the fault cause prediction model is able to predict the causes of faults which occur in a power grid. In some embodiments, the power grid fault evaluation controller 210 modifies the fault cause prediction model after a threshold amount of technician data is received. In some embodiments, the power grid fault evaluation controller 210 modifies one or more weights used by the fault cause prediction model.

In an example embodiment, the power grid fault evaluation controller 210 and/or computer-executable instructions stored on memory 201 of the power grid fault analysis system 101 are implemented using standard programming techniques. For example, the power grid fault evaluation controller 210 and/or computer-executable instructions stored on memory 201 of the power grid fault analysis system 101 may be implemented as a "native" executable running on CPU 202, along with one or more static or dynamic libraries. In other embodiments, the power grid fault evaluation controller 210 and/or computer-executable instructions stored on memory 201 of the power grid fault analysis system 101 may be implemented as instructions processed by a virtual machine that executes as some other program.

The embodiments described above may also use synchronous or asynchronous client-server computing techniques. However, the various components may be implemented using more monolithic programming techniques as well, for example, as an executable running on a single CPU computer system, or alternatively decomposed using a variety of structuring techniques known in the art, including but not limited to, multiprogramming, multithreading, client-server, or peer-to-peer, running on one or more computer systems each having one or more CPUs. Some embodiments may execute concurrently and asynchronously, and communicate using message passing techniques. Equivalent synchronous embodiments are also supported. Also, other functions could be implemented and/or performed by each component/module, and in different orders, and by different components/modules, yet still achieve the functions of the power grid fault analysis system 101.

In addition, programming interfaces to the data stored as part of the power grid fault evaluation controller 210 can be available by standard mechanisms such as through C, C++, C#, Java, and Web APIs; libraries for accessing files, databases, or other data repositories; through scripting languages such as JavaScript and VBScript; or through Web servers, FTP servers, or other types of servers providing access to stored data. The power grid fault evaluation controller 210 may be implemented by using one or more database systems, file systems, or any other technique for storing such information, or any combination of the above, including implementations using distributed computing techniques.

Different configurations and locations of programs and data are contemplated for use with techniques described herein. A variety of distributed computing techniques are appropriate for implementing the components of the embodiments in a distributed manner including but not limited to TCP/IP sockets, RPC, RMI, HTTP, Web Services (XML-RPC, JAX-RPC, SOAP, and the like). Other variations are possible. Also, other functionality could be provided by each component/module, or existing functionality could be distributed amongst the components/modules in different ways, yet still achieve the functions of the power grid fault analysis system 101 and electrical power grids 103.

Furthermore, in some embodiments, some or all of the components or portions of the power grid fault evaluation controller 210, and/or functionality provided by the computer-executable instructions stored on memory 201 of the power grid fault analysis system 101 may be implemented or provided in other manners, such as at least partially in firmware and/or hardware, including, but not limited to, one or more application-specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), and the like. Some or all of the system components and/or data structures may also be stored as contents (e.g., as executable or other machine-readable software instructions or structured data) on a computer-readable medium (e.g., as a hard disk; a memory; a computer network or cellular wireless network; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques. Such computer program products may also take other forms in other embodiments.

Accordingly, embodiments of this disclosure may be practiced with other computer system configurations.

Figure 3A:
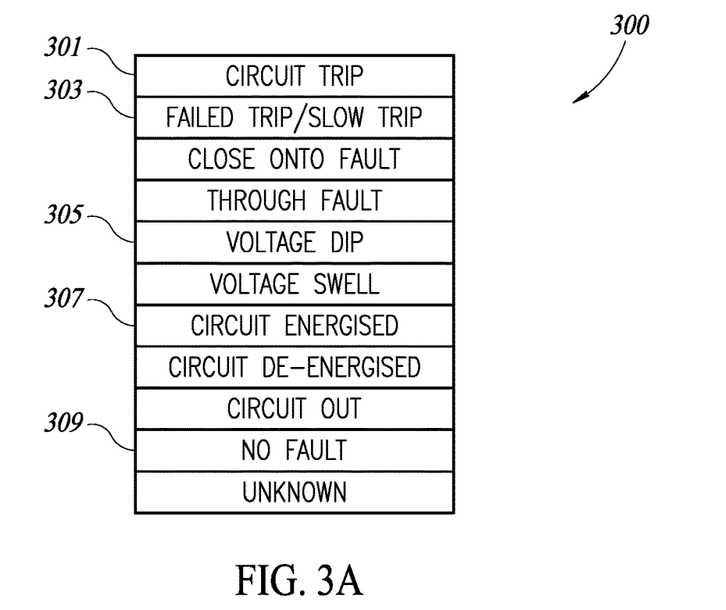
FIG. 3a is a sample fault category table depicting multiple fault categories used to classify faults, according to various embodiments described herein.

In general, a range of programming languages may be employed for implementing any of the functionality of the servers, functions, electrical power grid, electrical power grid components, etc., present in the example embodiments, including representative implementations of various programming language paradigms and platforms, including but not limited to, object-oriented (e.g., Java, C++, C#, Visual Basic.NET, Smalltalk, and the like), functional (e.g., ML, Lisp, Scheme, and the like), procedural (e.g., C, Pascal, Ada, Modula, and the like), scripting (e.g., Perl, Ruby, PHP, Python, JavaScript, VB Script, and the like) and declarative (e.g., SQL, Prolog, and the like). FIG. 3a is a sample fault category table 300 depicting multiple fault categories used to classify faults, according to various embodiments described herein. While the fault category table 300 includes a variety of fault categories, other fault categories may be included in the fault category table 300, and may be used by a power grid fault analysis system, such as the power grid fault analysis system 101. Furthermore, additional fault categories may be added to the fault category table 300 by the power grid fault analysis system. Examples of different fault categories included in the fault category table 300 include, but are not limited to, a circuit trip 301, a failed trip/slow trip 303, a voltage dip 305, circuit energized 307, and no fault 309. In some embodiments, the fault record categorizations are based on the patterns and changes of magnitude of at least one of the current sinusoidal waveforms of a three-phase circuit and the voltage sinusoidal waveforms of a three-phase circuit. Furthermore, in some embodiments, at least one of an AI or machine learning model trained to determine the category of a fault and a rules-based model configured to determine a category of the fault are used to determine the fault category. Such models may be included in a fault cause prediction model, such as the fault cause prediction model 214, and thus may also be modified, changed, altered, etc., based on technician data, such as technician data 216.

In the sample fault category table 300, a circuit trip 301 is a category of fault which indicates that the circuit is off supply. A failed trip 303 category indicates that a fault has occurred, but the circuit may or may not have switched off as it was supposed to. A voltage dip 305 category indicates that voltage has dropped below a predetermined voltage level of the circuit. A circuit energized 307 category indicates that a circuit with no voltage was switched on. A no fault 309 category indicates that no fault occurred.

Figure 3B:
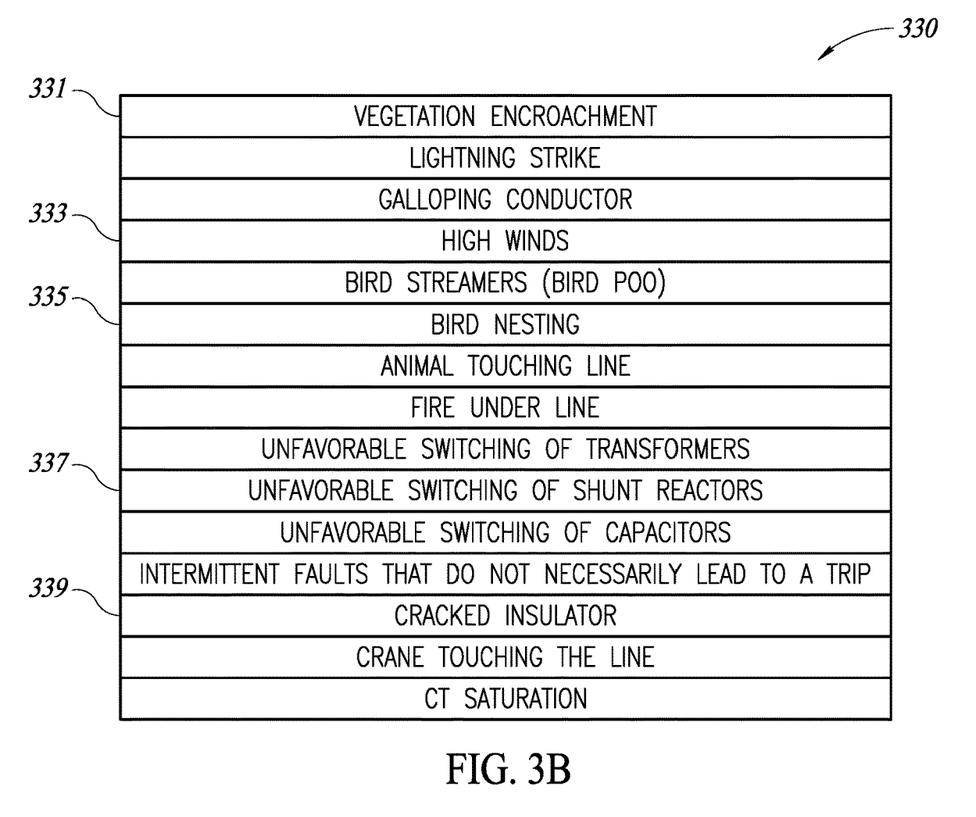
FIG. 3b is a sample fault cause table depicting potential causes of a fault, according to various embodiments described herein.

FIG. 3b is a sample fault cause table 330 depicting potential causes of a fault, according to various embodiments described herein. While the fault cause table 330 includes a variety of fault causes, other fault causes may be included in the fault cause table 330. Furthermore, additional fault causes may be added to the fault cause table 330 by a power grid fault analysis system. In some embodiments, once a cause of a fault which is not included in the fault cause table 330 is identified by one or more operators a predetermined number of times, the power grid fault analysis system may add the cause of the fault the fault cause table 330. In some embodiments, at least a portion of the fault causes have a distinct pattern in the relation of the voltage and current, as well as phase angle differences between voltage and current.

The sample fault cause table 330 includes a vegetation encroachment cause 331, a high winds cause 333, a bird nesting cause 335, an unfavorable switching of shunt reactors cause 337, and a cracked insulator cause 339. The vegetation encroachment cause 331 indicates that vegetation, such as plants, trees, etc., have caused a fault by encroaching on an aspect of at least one electrical power grid component. The high winds cause 333 indicates that high winds have caused a fault by interfering with, damaging, etc., an aspect of at least one electrical power grid component. The bird nesting cause 335 indicates that a fault was caused by one or more birds which have nested near at least one electrical power grid component. The unfavorable switching of shunt reactors cause 337 indicates that the fault was caused by a circuit switch which occurred under unfavorable conditions. The cracked insulator cause 339 indicates that the fault was caused by one or more cracks in an insulator associated with at least one electrical power grid component.

Figure 3C:
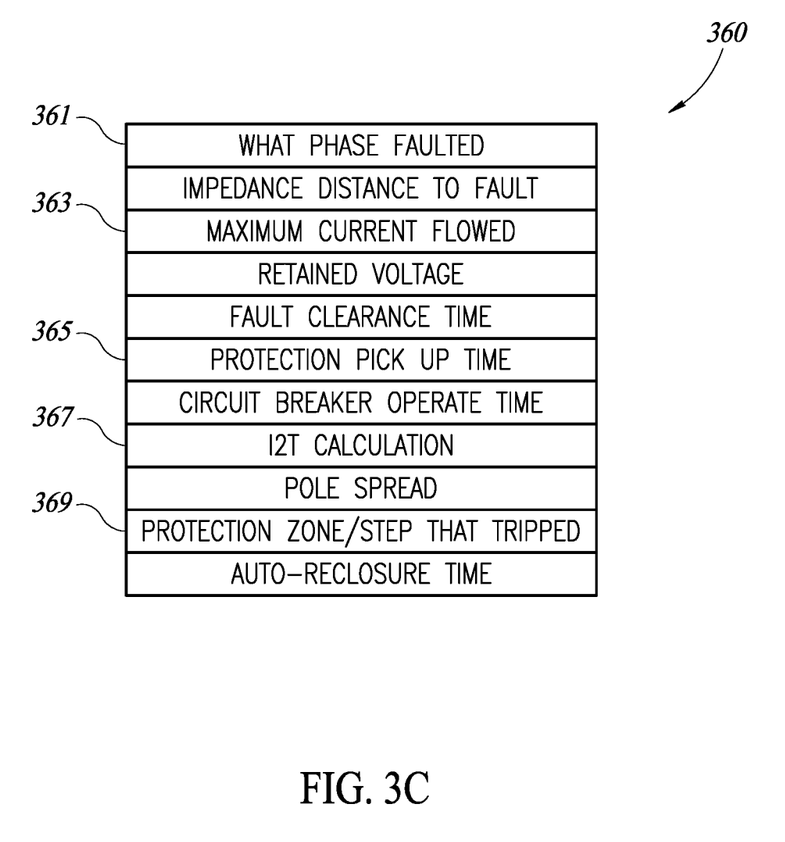
FIG. 3c is a sample fault parameter table depicting various fault parameters which may be generated by a power grid fault analysis system, according to various embodiments described herein.

FIG. 3c is a sample fault parameter table 360 depicting various fault parameters which may be generated by a power grid fault analysis system, according to various embodiments described herein. While the fault parameter table 360 includes a variety of fault parameters, other fault parameters may be included in the fault parameter table 360. Furthermore, additional fault parameters may be added to the fault parameter table 360 by the power grid fault analysis system. In some embodiments, the power grid fault analysis system calculates such parameters by using a fault cause prediction model, such as the fault cause prediction model 214, a rules-based algorithm configured to calculate such parameters, an AI or machine learning model configured to generate such parameters, or perform other methods of analyzing a fault record to generate such parameters. Such models may be modified, altered, changed, etc. based on technician data, such as technician data 216.

In some embodiments, the parameters are derived from a combination of analogue and digital inputs contained within a fault record. For example, fault inception may be determined by a sudden change in magnitude of a phase current and/or a sudden change in magnitude of a phase voltage.

The time of fault inception may be used as a reference point to measure the period for relay, protection signaling and breaker operations. Analysis of changes in magnitude of the phase currents and voltages may determine what phases are involved in the fault. An auto-reclose time period may be from when the circuit is initially tripped to when it is energized again. It also may be likely that the re-close operation may be on a different fault record.

Furthermore, processing of the parameters may determine if the power grid reacted correctly to the disturbance. Pre-configured rules may be actioned to detect if the relay, protection signaling or breaker operations were outside programmed limits. Abnormal operations may be flagged in a report, a list view, a map, etc.

Additionally, a "through Fault" Activity log may be generated by the power grid fault cause analysis system to contribute to a transformer asset health index assessment. The magnitude of the "through fault" event may be the max half cycle value of the current that the LV side of a transformer contributes to a fault.

The fault parameters included in the sample fault parameter table 360 include, but are not limited to, the phase that faulted 361, the maximum current flowed 363, the protection pick-up time 365, an I2T calculation 367, and a protection zone that tripped 369. The phase that faulted 361 indicates one or more phases of a multi-phase power system associated with a fault. The maximum current flowed 363 indicates the maximum current that flowed on any of the faulted phases during a fault event. The protection pick-up time 365 indicates the amount of time from fault inception to when the relay starting element is engaged. The I2T calculation 367 indicates a measure of the accumulated energy dissipated in a circuit breaker contact set when a fault current is interrupted. The protection zone that tripped 369 indicates the protection relay element that issued a trip command to operate a circuit breaker.

For example, fault inception may be determined by a sudden change in magnitude of a phase current, a sudden change in magnitude of a phase voltage, etc. The time of a fault inception may be used as a reference point to measure a period for relay, protection signaling, and breaker operations. Analysis of the change in magnitude of phase currents and voltages may be used to determine which phases are involved in the fault. Analysis of the change in magnitude of phase currents and voltages may also be used to determine when the auto-reclose time period occurs after the fault occurs. The processed parameters may be used by a power grid fault analysis system to determine if the power grid reacted correctly to the disturbance indicated by the primary fault record. Pre-configured rules, such as in the rules-based algorithm, learned by the AI or machine learning model, etc., may be used to detect if the relay, protection signaling, or breaker operations were outside programmed limits. Abnormal operations identified by the power grid fault analysis system may be indicated to an operator.

Figure 4:
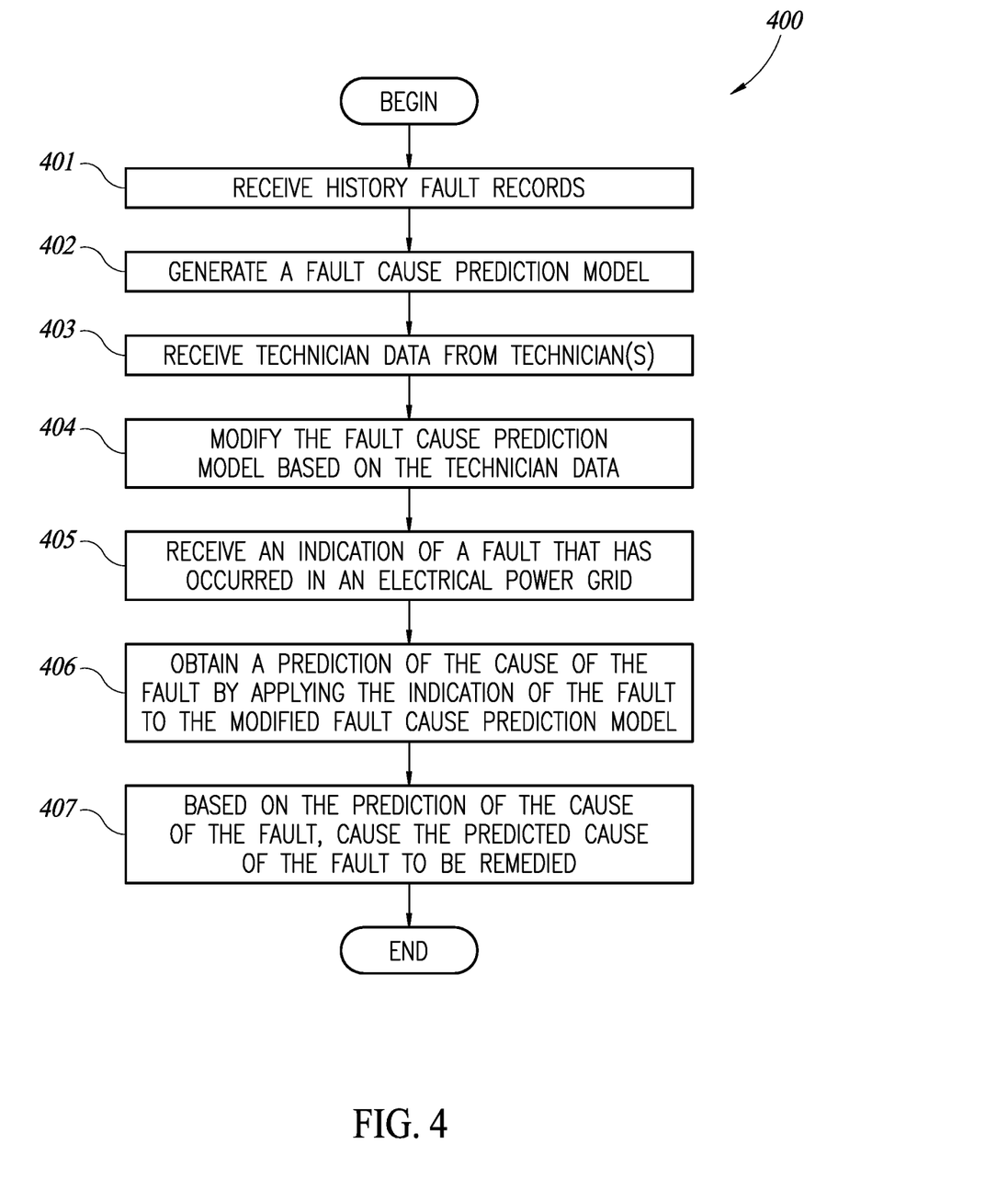
FIG. 4 is a flow diagram depicting a process used by a power grid fault analysis system to generate a fault cause prediction model, according to various embodiments described herein.

The fault parameters included in the sample fault parameter table 360 include, but are not limited to, the phase that faulted 361, the maximum current flowed 363, the protection pick-up time 365, an I2T calculation 367, an a protection zone that tripped 369. FIG. 4 is a flow diagram depicting a process 400 used by a power grid fault analysis system to generate a fault cause prediction model, according to various embodiments described herein. The process 400 begins, after a start block, at act 401, where the power grid fault analysis system receives historical fault records. In some embodiments, the historical fault records are received from one or more power grids. In some embodiments, the historical fault records include one or more of: a category of a fault, a cause of the fault, equipment associated with the fault, power grid components associated with the fault, third party data used to determine the cause of the fault, parameters of the fault, or other data related to a fault.

After act 401, the process 400 proceeds to act 402. At act 402, the power grid fault analysis system generates a fault cause prediction model based on the historical fault records. In some embodiments, the fault cause prediction model includes one or more of an AI or machine-learning model trained to predict the cause of a fault and a rules-based model configured to predict the cause of a fault. In some embodiments, as part of generating the fault cause prediction model, the power grid fault analysis system trains an AI or machine learning model to generate a prediction of the cause of a fault based on the historical records.

In some embodiments, at least a portion of the fault cause prediction model is trained by using supervised learning techniques. The power grid fault analysis system may collect and categorize voltage and current signals obtained from the historical fault records into a training dataset. The signals may be preprocessed by using statistical methods, principal component analysis, or some combination thereof, in order to reduce time vectors into a smaller set of characteristic features. The characteristic features may be used by the power grid fault analysis system to train the fault cause prediction model to map features onto fault categories. The fault cause prediction model may then generate predictions for new signals to predict a category of the fault. The fault cause prediction model may label predictions with low confidence into an "unknown" category. The predictions labelled as unknown may be recategorized by an operator or technician and fed back into the fault cause prediction model training. After act 402, the process 400 proceeds to act 403. At act 403, the power grid fault analysis system receives technician data from one or more technicians, such as technician data 216. In some embodiments, the technician data includes an indication of at least one additional historical fault and at least one cause of the additional historical fault. In some embodiments, the power grid fault analysis system causes the technician data to be validated after receiving the technician data. The power grid fault analysis system may cause the technician data to be validated by one or more of: causing technician data to be presented to a technician for validation; validating the technician data based on statistical analysis; or other methods of validating data.

After act 403, the process 400 proceeds to act 404. At act 404, the power grid fault analysis system modifies the fault cause prediction model based on the technician data. In some embodiments the power grid fault analysis system performs act 404 by using at least one of the processes described below in connection with FIGS. 5 and 6. In some embodiments, the power grid fault analysis system modifies the fault cause prediction model by re-training the fault cause prediction model with at least the technician data.

After act 404, the process 400 proceeds to act 405. At act 405, the power grid fault analysis system receives an indication of a fault that has occurred in an electrical power grid.

After act 405, the process 400 proceeds to act 406. At act 406, the power grid fault analysis system obtains a prediction of the cause of the fault by applying the indication of the fault to the modified fault cause prediction model.

After act 406, the process 400 proceeds to act 407. At act 407, the power grid fault analysis system causes the predicted cause of the fault to be remedied.

After act 407, the process 400 ends. In some embodiments, the detected fault, the prediction of its cause obtained in act 405, or other data related to the detected fault are added to the technician data. Thus, in such embodiments, the fault cause prediction model is able to be modified based on its own performance.

In some embodiments, the power grid fault analysis system identifies additional fault records based on one or more of a fault record and a prediction of the cause of the fault associated with the fault record. The additional fault records may be generated by at least one other substation which is a different substation from the substation which generated the fault record. The power grid fault analysis system may modify the fault cause prediction model based on one or more of the additional fault records and the first fault record to identify fault records related to a fault.

In some embodiments, the power grid fault analysis system identifies additional fault records within the technical data which are generated by substations in power grids other than the power grid described in act 405 based on the indication of the fault received in act 405. The power grid fault analysis system may identify secondary fault records for each additional fault record based on one or more of an indication of a fault, such as the indication described in act 405, and a cause of a fault. The power grid fault analysis system may use the additional fault records to modify the fault cause prediction model to identify additional fault records, secondary fault records, etc., related to a fault based on an indication of a fault. In some embodiment, the additional fault records are used to improve a fault cause prediction model's ability to identify additional fault records, secondary fault records, etc. based on an indication of a fault.

Figure 5:
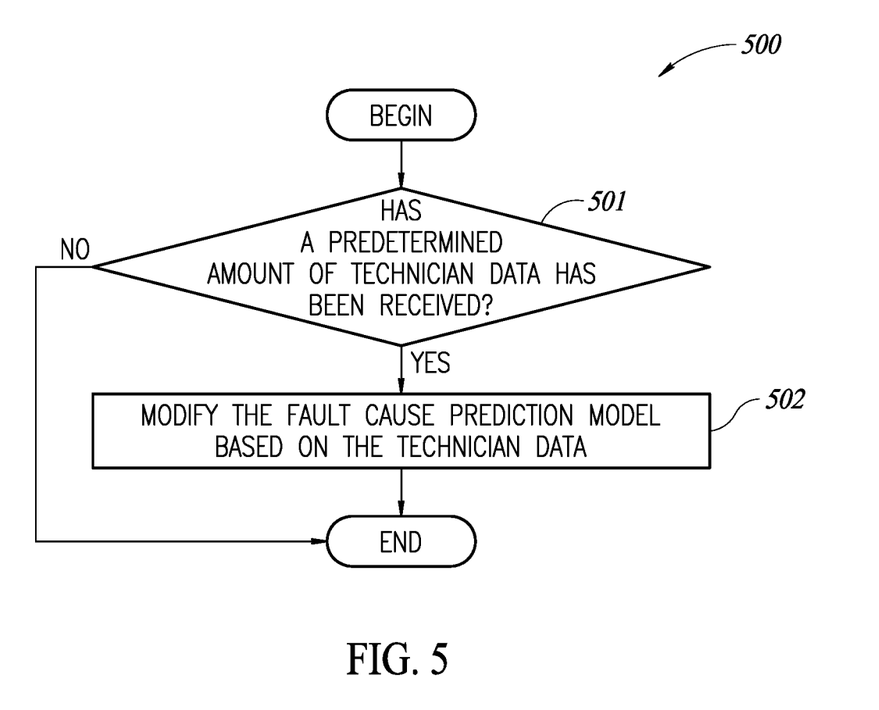
FIG. 5 is a flow diagram depicting a process used by a power grid fault analysis system to cause a fault cause prediction model to be modified, according to various embodiments described herein.

FIG. 5 is a flow diagram depicting a process 500 used by a power grid fault analysis system to cause a fault cause prediction model to be modified, according to various embodiments described herein. The process 500 begins, after a start block, at act 501, where the power grid fault analysis system determines whether a predetermined amount of technician data has been received. If the predetermined amount of technician data has not been received, the process 500 ends, otherwise the process 500 continues to act 502.

At act 502, the power grid fault analysis system modifies the fault cause prediction model based on the technician data. In some embodiments, aspects of the fault cause prediction model are re-trained based on the technician data. In some embodiments, the fault cause prediction model is modified to be able to identify one or more of: new fault causes, new fault parameters, new fault categories, etc. In some embodiments, the fault cause prediction model is modified based on the process described below with respect to FIG. 6.

After act 502, the process 500 ends. In some embodiments, the predetermined amount of technician data is based on the accuracy of the fault cause prediction model in identifying faults. For example, as the accuracy of the fault cause prediction model increases, the predetermined amount of technician data needed to trigger modification, alteration, changing, re-training, etc., of the fault cause prediction model may also increase.

In some embodiments, the predetermined amount of technician data is based on a determination that new causes of faults have been identified. For example, in some embodiments, after a new cause of a fault unknown to the fault cause prediction model is identified multiple times, the power grid fault analysis system modifies the fault cause prediction model to be able to identify the new cause of a fault.

Figure 6:
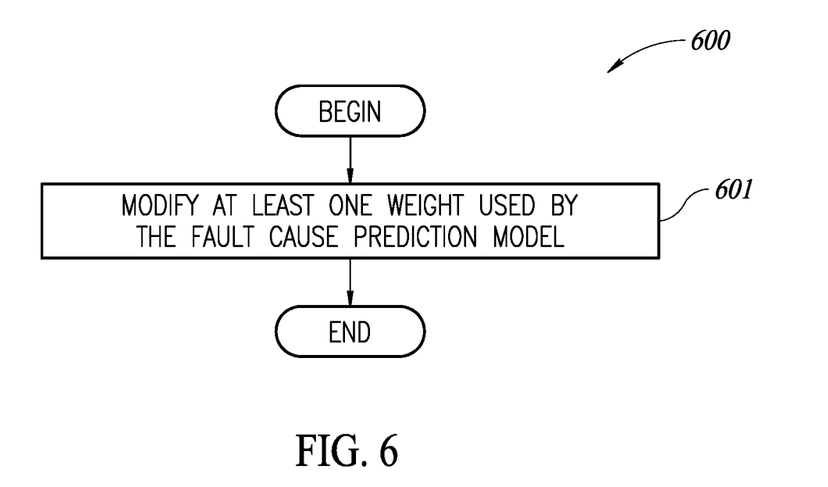
FIG. 6 is a flow diagram depicting a process for modifying a fault cause prediction model, according to various embodiments described herein.

FIG. 6 is a flow diagram depicting a process 600 for modifying a fault cause prediction model, according to various embodiments described herein. The process 600 begins, after a start block, at act 601, where the power grid fault analysis system modifies at least one weight used by the fault cause prediction model.

In some embodiments, the at least one weight is a weight which is used to determine a final prediction of the cause of the fault based on a first prediction of the cause of the fault and a second prediction of the cause of the fault generated by the fault cause prediction model. For example, the weight may adjust the likelihood that a first prediction of the cause of a fault generated by a machine learning model for a fault in a certain category of faults to be more likely to be the final prediction of the cause of the fault when compared to a second prediction of the cause of the fault generated by a rules-based algorithm. In some embodiments, the at least one weight is at least one weight used by at least one of a machine learning model included in the fault cause prediction system or a rules-based algorithm included in the fault cause prediction system.

After act 601, the process 600 ends.

Figure 7:
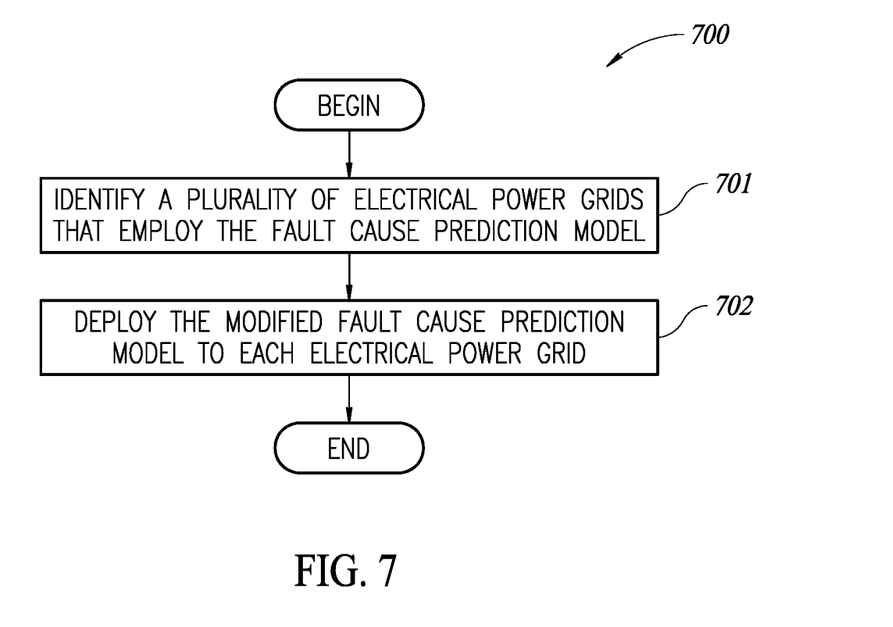
FIG. 7 is a flow diagram depicting a process used by a power grid fault analysis system to deploy modified versions of a fault cause prediction model to a plurality of power grids.

FIG. 7 is a flow diagram depicting a process 700 used by a power grid fault analysis system to deploy modified versions of a fault cause prediction model to a plurality of power grids. The process 700 begins, after a start block, at act 701, where the power grid fault analysis system identifies a plurality of electrical power grids that employ the fault cause prediction model. In some embodiments, the power grids identified in act 701 are power grids which have communicated technician data, such as technician data 216, to the power grid fault analysis system.

After act 701, the process 700 continues to act 702. At act 702, the power grid fault analysis system deploys the modified fault cause prediction model to each of the identified power grids. In some embodiments, the power grid fault analysis system deploys the fault cause prediction model by transmitting an indication of the model to a computing system or device associated with each respective power grid, such as a device accessible to an operator or technician.

After act 702, the process 700 ends.

Figure 8:
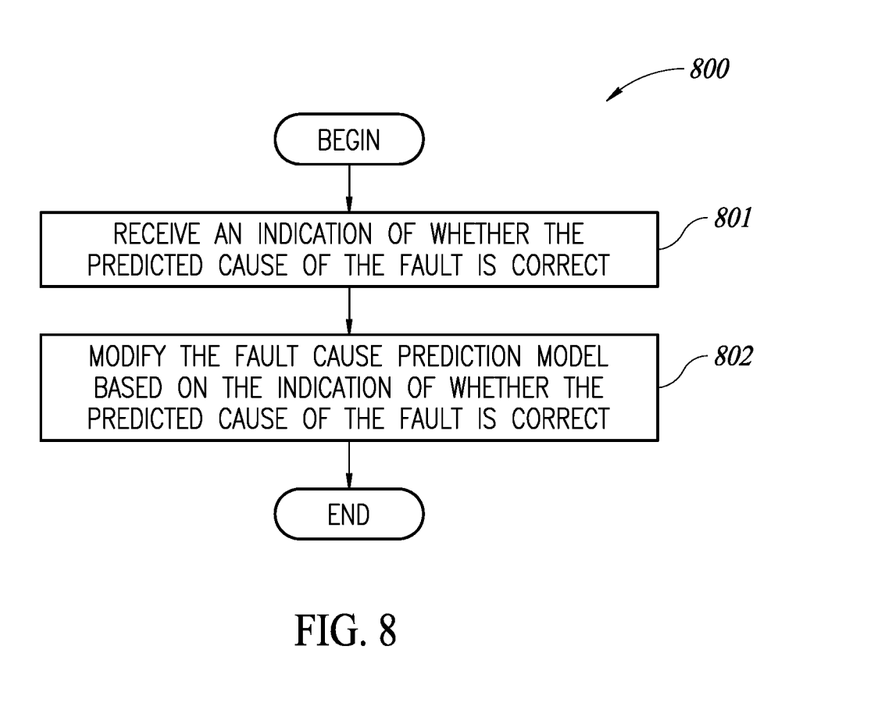
FIG. 8 is a process used by a power grid fault analysis system to modify a fault cause prediction model based on an indication of whether the predicted cause of the fault is correct, according to various embodiments described herein.

FIG. 8 is a process 800 used by a power grid fault analysis system to modify a fault cause prediction model based on an indication of whether the predicted cause of the fault is correct, according to various embodiments described herein. The process 800 begins, after a start block, at act 801 where the power grid fault analysis system receives an indication of whether the predicted cause of the fault is correct. In some embodiments, the power grid fault analysis system receives the indication of whether the predicted cause of the fault is correct from an operator or technician computing device. In some embodiments, the indication of whether the predicted cause of the fault is correct includes data indicating one or more of: the actual cause of the fault, one or more fault records associated with the fault, at least one fault category, at least one fault parameter, or other data associated with the fault. In some embodiments, the indication of whether the predicted cause of the fault is correct is included in technician data, such as technician data 216.

After act 801, the process 800 continues to act 802. At act 802, the power grid fault analysis system modifies, changes, alters, etc., the fault cause prediction model based on the indication of whether the predicted cause of the fault is correct. In some embodiments, act 802 is performed in a similar manner to act 502. In some embodiments, the power grid fault analysis system does not perform act 802 until a threshold number of indications of whether a predicted cause of the fault is correct is received.

After act 802, the process 800 ends.

Figure 9:
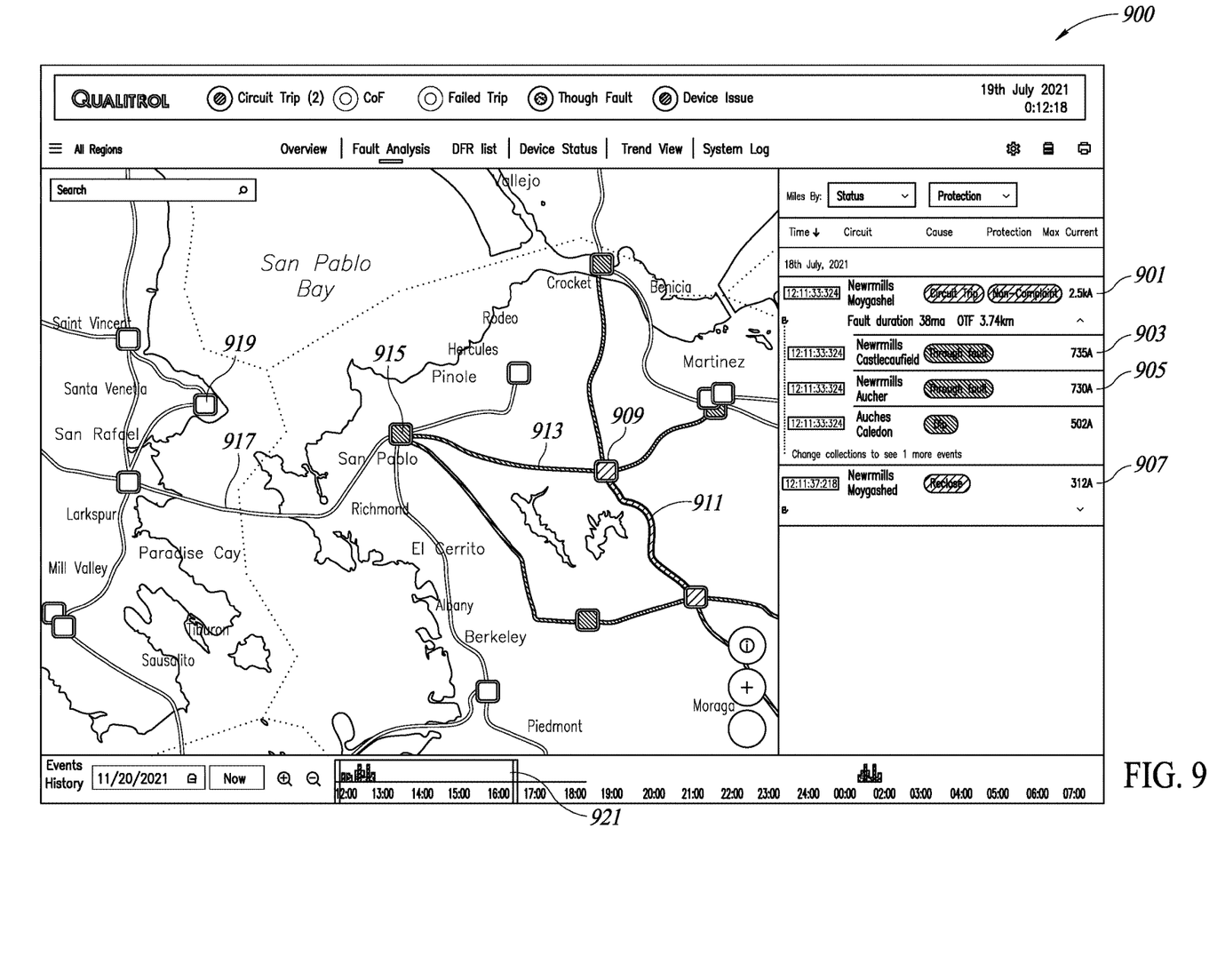
FIG. 9 is a sample map diagram of a map generated by a power grid fault analysis system, according to various embodiments described herein.

FIG. 9 is a sample map diagram of a map 900 generated by a power grid fault analysis system, according to various embodiments described herein. The map 900 includes primary fault indicators 901 and 907, secondary fault indicators 903 and 905, substation indicators 909, 915, and 919, power line indicators 911, 913, and 917, and a fault history slider 921. The map 900 may be generated by the power grid fault analysis system and caused to be presented to an operator via an operator computing device. In some embodiments, the power grid fault analysis system generates the map 900 as part of causing the cause of the fault to be remedied. An indication of the generated map 900 may be transmitted to an operator or technician computing device, such that the operator or technician is able to quickly and reliably identify secondary faults associated with a primary fault, as well as the cause of the primary fault and each of the secondary faults.

The primary fault indicators 901 and 907 each indicate that a primary fault has occurred during a time period denoted by the slider 921. The primary fault indicators each include a category of the fault, a cause of the fault, and parameters related to the fault. The primary fault indicators may also include an indication of a location of the fault. Additionally, a fault indicator, such as a primary fault indicator may be associated with a substation indicator. For example, the primary fault indicator 901 indicates that a circuit trip occurred at the Newmills substation. Likewise, because a primary fault has occurred at the Newmills substation, the substation indicator 909 is colored to indicate that the primary fault has occurred at that location.

The primary fault indicators may additionally include secondary fault indicators, such as the secondary fault indicators 903 and 905 which are included with the primary fault indicator 901. The secondary fault indicators represent secondary faults which have occurred as a result of the primary fault. Thus, in the map 900, the secondary faults indicated by secondary fault indicators 903 and 905 were determined, by the power grid fault analysis system, to be caused by the primary fault indicated by primary fault indicator 901.

In determining whether the secondary faults were caused by a certain primary fault, the power grid fault analysis system may use the map 900 to determine if the secondary faults have a connection to the primary fault, such as through a power line. As can be seen in the map 900, substation 919 is not directly connected to the substation 915 via a power line. The nearest power line connection to substation 915 is power line 917. Thus, the power grid fault analysis system may determine that even though a fault of some kind may have occurred in the substation 919, it cannot be related to the fault at substation 909 because there is no trail of faults that lead to substation 919 from substation 909.

In an example embodiment, the map 900 color codes electrical power grid components, such as: flashing red indicating a non-compliant disturbance, red indicating a trip, orange indicating a through fault, yellow indicating a voltage dip, and blue indicating other disturbances or faults. In another example embodiment, the map 900 is accompanied by a list view of fault records where various events are color coded based on event importance, compliance to thresholds, etc.

In another example embodiment, an operator may interact with the fault record in a viewer to graphically show the analogue and digital inputs on a time/magnitude axis. In this example, the operator may be able to view a waveform of the fault in a horizontal or vertical direction, make measurements of amplitude and time, etc.

In another example embodiment, the power grid fault cause analysis system is able to use pattern matching to differentiate between various root causes, such as tree strikes versus lightning strikes versus crane touch versus cracked insulators, etc.

Figure 10:
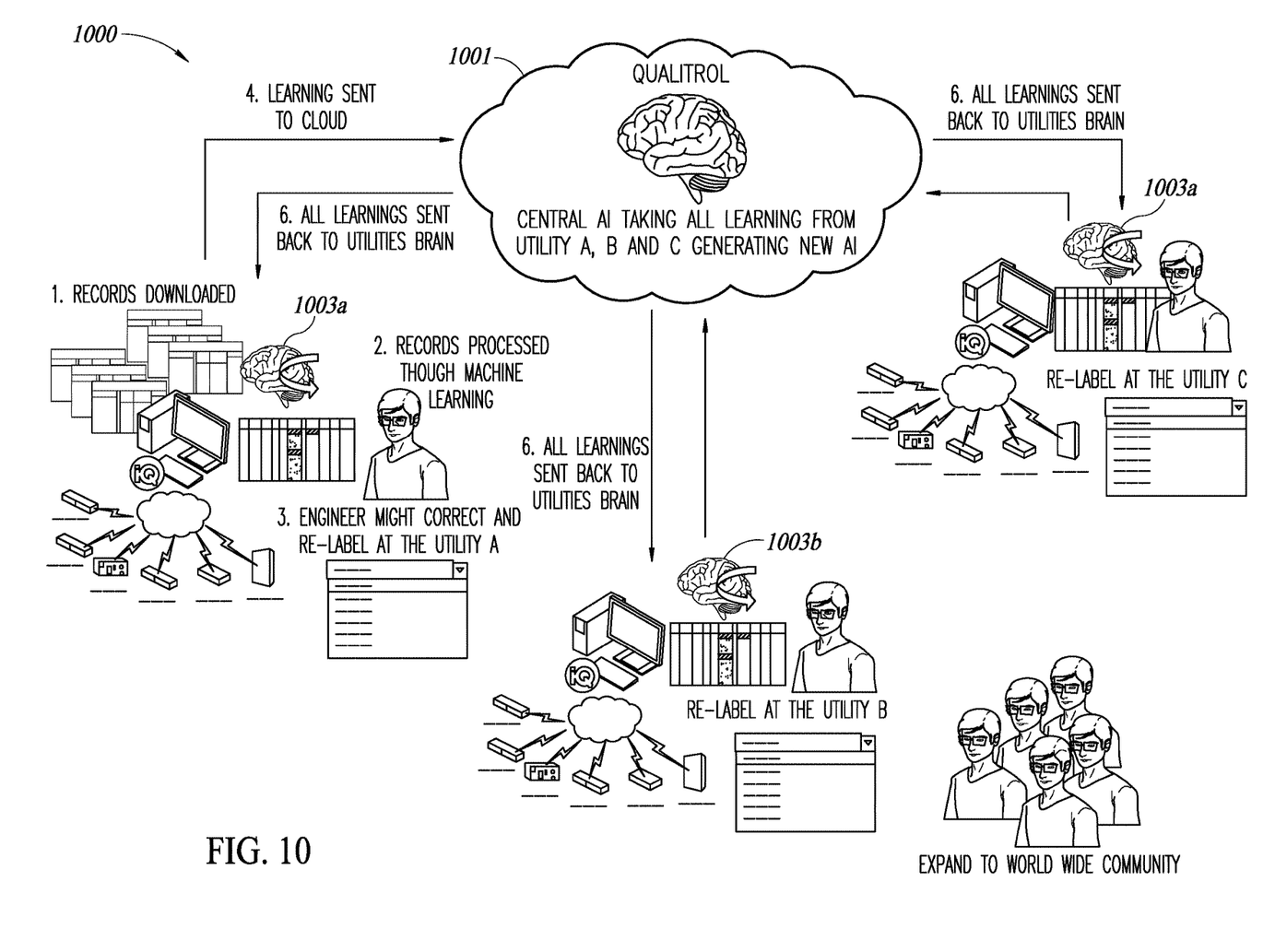
FIG. 10 is a display diagram depicting an example embodiment of the power grid fault analysis system, according to various embodiments described herein.

FIG. 10 is a display diagram 1000 depicting an example embodiment of the power grid fault analysis system, according to various embodiments described herein. FIG. 10 includes a power grid fault analysis system hub 1001, monitored power grids 1003*a*-1003*c* (collectively "monitored power grids 1003"), and additional utilities 1005.

The power grid fault analysis system hub 1001 includes a power grid fault analysis system and communicates with the monitored power grids 1003. Each of the monitored power grids may have access to a fault cause prediction model which receives an indication of a fault and predicts a cause of the fault. The power grid fault analysis system hub 1001 receives technician data from each of the monitored power grids 1003. The received technician data may be related to one or more faults whose causes have been predicted by the fault cause prediction system. Furthermore, the technician data may include fault data that has been updated by an operator or technician.

Technicians may also correct and re-label fault records, fault categories, fault parameters, or some combination thereof, as they occur. The technician data may additionally include data regarding the corrections and re-labelling performed by the technicians.

Once the power grid fault analysis system hub 1001 receives the technician data from the monitored power grids, the power grid fault analysis system hub 1001 may aggregate the technician data, and convert the aggregated data into a form which can be used to modify the fault cause prediction model. The power grid fault analysis system hub 1001 uses the aggregated data to modify the fault cause prediction model and pushes the modified fault cause prediction model to each of the monitored power grids. The power grid fault analysis system hub 1001 may also push the modified fault cause prediction model to the additional utilities 1005, even if the additional utilities 1005 do not provide technician data to the power grid fault analysis system hub 1001. Thus, in the example embodiment depicted in the display diagram 1000, the power grid fault analysis system is able to improve power grids and utilities which contribute fault data to the system, as well as utilities which do not contribute fault data to the system.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system for artificial intelligence (AI) continued learning in an electrical power grid fault analysis, comprising:
   at least one processor; and
   at least one memory coupled to the at least one processor, the at least one memory having computer-executable instructions stored thereon that, when executed by the at least one processor, cause the system to:

electronically receive a plurality of historical fault records in an electrical power grid including a plurality of substations, each historical fault record including:
 a category of a fault; and
 a cause of the fault;

electronically generate a fault cause prediction model based on the plurality of historical fault records;

electronically receive technician data from one or more technicians, the technician data including an indication of at least one additional historical fault and at least one cause of the additional historical fault;

electronically modify the fault cause prediction model based on the technician data;

electronically receive an indication of a fault that has occurred in the electrical power grid, the indication including a fault record associated with the fault, the fault record being generated by a substation of the plurality of substations;

electronically obtain a prediction of the cause of the fault by applying the indication of the fault to the modified fault cause prediction model; and based on the prediction of the cause of the fault, electronically cause the predicted cause of the fault to be remedied.

2. The system of claim 1, wherein the fault cause prediction model comprises one or more of:
 a machine learning model; and/or
 a rules-based model.

3. The system of claim 1, wherein the technician data further comprises:
 data indicating the status of one or more pieces of equipment associated with the additional historical fault; and
 data indicating whether at least one piece of equipment of the one or more pieces of equipment was repaired after the additional historical fault occurred.

4. The system of claim 1, wherein to electronically modify the fault cause prediction model, the computer-executable instructions further cause the system to:
 electronically determine whether a predetermined amount of technician data has been received from the one or more technicians; and
 based on a determination that the predetermined amount of technician data has been received, electronically modify the fault cause prediction model based on the technician data.

5. The system of claim 1, wherein the fault cause prediction model comprises at least one machine learning model and at least one rules-based model, and to electronically modify the fault cause prediction model, the computer-executable instructions further cause the system to:
 electronically modify, based on the technician data, one or more weights used by the fault cause prediction model to combine a first prediction obtained from the at least one machine learning model with a second prediction obtained from the at least one rules-based model.

6. The system of claim 1, wherein the computer-executable instructions further cause the system to:
 electronically identify a plurality of electrical power grids that employ the fault cause prediction model; and
 electronically deploy the modified fault cause prediction model to each electrical power grid of the plurality of electrical power grids.

7. The system of claim 1, wherein the computer-executable instructions further cause the system to:
 electronically receive an indication of whether the predicted cause of the fault is correct; and
 electronically modify the fault cause prediction model based on the indication of whether the predicted cause of the fault is correct.

8. The system of claim 1, wherein the computer-executable instructions further cause the system to:
 electronically identify, based on at least the fault record and the prediction of the cause of the fault, one or more additional fault records which are related to the fault record, the additional fault records being generated from by at least one other substation of the plurality of substations, wherein the at least one other substation is a different substation than the substation which generated the first fault record; and
 electronically modify the fault cause prediction model, based on at least the additional fault records, to identify additional fault records which are related to a fault.

9. A method for artificial intelligence (AI) continued learning in an electrical power grid fault analysis, the method comprising:
 receiving an indication of a plurality of historical fault records in an electrical power grid including a plurality of substations, each historical fault record including:
  a category of a fault; and
  a cause of the fault;
 generating a fault cause prediction model based on the plurality of historical fault records;
 receiving technician data from one or more technicians, the technician data including an indication of at least one additional historical fault and at least one cause of the additional historical fault;
 modifying the fault cause prediction model based on the technician data;
 receiving an indication of a fault that has occurred in the electrical power grid, the indication including a fault record associated with the fault;
 obtaining a prediction of the cause of the fault by applying the indication of the fault to the modified fault cause prediction model; and
 based on the prediction of the cause of the fault, electronically cause the predicted cause of the fault to be remedied.

10. The method of claim 9, wherein modifying the fault cause prediction model comprises:
 determining whether a predetermined amount of technician data has been received from the one or more technicians; and
 based on a determination that the predetermined amount of technician data has been received, modifying the fault cause prediction model based on the technician data.

11. The method of claim 9, wherein the fault cause prediction model comprises at least one machine learning model and at least one rules-based model, and wherein modifying the fault cause prediction model comprises:
 modifying, based on the technician data, one or more weights used by the fault cause prediction model to combine a first prediction obtained from the at least one machine learning model with a second prediction obtained from the at least one rules-based model.

12. The method of claim 9, further comprising:
 identifying a plurality of electrical power grids that employ the fault cause prediction model; and transmitting the modified fault cause prediction model to each electrical power distribution system of the plurality of electrical power grids.

13. The method of claim 9, further comprising:
receiving an indication of whether the predicted cause of the fault is correct; and
modifying the fault cause prediction model based on the indication of whether the predicted cause of the fault is correct.

14. A nontransitory processor-readable storage medium that stores at least one of instructions, the instructions, when executed by at least one processor, cause the at least one processor to:
receive an indication of a plurality of historical fault records in an electrical power grid including a plurality of substations, each historical fault record including:
a category of a fault; and
a cause of the fault;
generate, based on the plurality of historical fault records, a fault cause prediction model that predicts the cause of a fault based on a fault record;
receive technician data from one or more technicians, the technician data including an indication of at least one additional historical fault and at least one cause of the additional historical fault; and
modify the fault cause prediction model based on the technician data.

15. The nontransitory processor-readable storage medium of claim 14, wherein to modify the fault cause prediction model the at least one processor is further caused to:
determine whether a predetermined amount of technician data has been received from the one or technicians; and
based on a determination that the predetermined amount of technician data has been received, modify the fault cause prediction model based on the technician data.

16. The nontransitory processor-readable storage medium of claim 14, wherein the fault cause prediction model comprises at least one machine learning model and at least one rules-based model, and wherein to modify the fault cause prediction model the at least one processor is further caused to:
modify, based on the technician data, one or more weights used by the fault cause prediction model to combine a first prediction obtained from the at least one machine learning model with a second prediction obtained from the at least one rules-based model.

17. The nontransitory processor-readable storage medium of claim 14, wherein the at least one processor is further caused to:
identify a plurality of electrical power grids that employ the fault cause prediction model; and
transmit an indication of the modified fault cause prediction model to each electrical power grid of the plurality of electrical power grids.

18. The nontransitory processor-readable storage medium of claim 14, wherein the at least one processor is further caused to:
receive an indication of a fault that has occurred in the electrical power grid, the indication including a fault record associated with the fault;
obtain a prediction of the cause of the fault by applying the indication of the fault to the modified fault cause prediction model;
receive an indication of whether the predicted cause of the fault is correct; and
modify the fault cause prediction model based on the indication of whether the predicted cause of the fault is correct.

* * * * *